US009277632B2

(12) United States Patent
Hegarty (10) Patent No.: US 9,277,632 B2
(45) Date of Patent: Mar. 1, 2016

(54) EMERGENCY LIGHTING MONITORING AND REPORTING SYSTEM

(71) Applicant: Signtex, Inc., Grasonville, MD (US)

(72) Inventor: William Hegarty, Grasonville, MD (US)

(73) Assignee: Signtex, Inc., Grasonville, MD (US)

( * ) Notice: Subject to any disclaimer, the term of this patent is extended or adjusted under 35 U.S.C. 154(b) by 0 days.

(21) Appl. No.: 14/265,107

(22) Filed: Apr. 29, 2014

(65) Prior Publication Data

US 2014/0320011 A1    Oct. 30, 2014

Related U.S. Application Data

(60) Provisional application No. 61/817,138, filed on Apr. 29, 2013, provisional application No. 61/976,249, filed on Apr. 7, 2014.

(51) Int. Cl.
| | |
|---|---|
| *G05F 1/14* | (2006.01) |
| *H05B 37/03* | (2006.01) |
| *H02J 9/06* | (2006.01) |
| *H05B 33/08* | (2006.01) |
| *H02J 9/02* | (2006.01) |
| *G09F 13/04* | (2006.01) |
| *F21S 8/02* | (2006.01) |

(52) U.S. Cl.
CPC . *H05B 37/03* (2013.01); *H02J 9/02* (2013.01); *H02J 9/061* (2013.01); *H05B 33/0842* (2013.01); *F21S 8/02* (2013.01); *G09F 13/04* (2013.01); *Y02B 20/42* (2013.01)

(58) Field of Classification Search
CPC ................ F21S 8/02; G05F 1/14; G05F 1/56; H05B 37/0272; H05B 33/0842

USPC .................. 340/693.1, 693.2, 693.4, 310.11, 340/310.12, 636.1, 636.19, 636.2, 825.36, 340/7.2, 7.32, 333; 324/764.01, 763.01; 315/185 S, 291, 307–326

See application file for complete search history.

(56) References Cited

U.S. PATENT DOCUMENTS

| | | | |
|---|---|---|---|
| 4,799,039 | A | 1/1989 | Balcom et al. |
| 4,843,300 | A | 6/1989 | Alderman |
| 6,502,044 | B1 | 12/2002 | Lane et al. |
| 2012/0007516 | A1 | 1/2012 | Lax et al. |
| 2012/0127702 | A1 | 5/2012 | Lax et al. |
| 2015/0296599 | A1* | 10/2015 | Recker ............... H05B 37/0272 315/153 |

OTHER PUBLICATIONS

You Can Count on FIDO, Press Release, pp. 1-6, Jul. 1, 2010.
FIDO, Frequently Asked Questions, Lithonia Lighting, www.lithonia.com/fido, copyright 2010-2012 rev Jul. 2012; document accessed from www.acuitybrands.com on Aug. 18, 2014.

(Continued)

*Primary Examiner* — Tuyet Vo
(74) *Attorney, Agent, or Firm* — Zollinger & Burleson Ltd.

(57) ABSTRACT

An emergency lighting system with central batteries power remote LED fixtures and exit signs, with all components integrated throughout a single or multiple buildings. Status reports are available on demand and the system will generate written records required by the Life Safety Code. A wide range of fixtures optimized for emergency lighting are available for interior and exterior applications and all can be monitored via internet, with report displays available on any digital device. Easy access to batteries, automated testing, high lumen outputs, efficient optics and long lamp life ensure the lowest possible life cycle costs.

23 Claims, 5 Drawing Sheets

(56) References Cited

OTHER PUBLICATIONS

Depend on FIDO, Acuity Brands, copyright 2014, document accessed from www.acuitybrands.com on Aug. 18, 2014.
Trial Installation Program, FIDO, copyright 2010-2012 rev Jul. 2012; document accessed from www.acuitybrands.com on Aug. 18, 2014.
LD=A, Shopping for Answers, Don't Let Emergency Lighting Testing Fall Through the Cracks, by Robin Martin, May 2009.
FIDO, Pre-Deployment Checklist, Jul. 2011, document accessed from www.acuitybrands.com on Aug. 18, 2014.
Acuity Brands, www.acuitybrands.com, accessed on Aug. 18, 2014, FIDO webpages.
Emergi-Lite, NEXUS Monitoring System, accessed on Aug. 18, 2014 from www.emergi-lite.com/usa/nexus.asp.
NEXUS, Emergency Lighting Management System, accessed on Aug. 18, 2014 from www.emergi-lite.com/usa/nexus.asp.
NEXUS, Emergency Lighting Management System, Nexus Wired, accessed on Aug. 18, 2014 from www.emergilite.com/usa/nexus.asp.
Dual Lite, Spectron, Dec. 2007.
NEXUS RF, Emergency Lighting Management System, accessed on Aug. 18, 2014 from www.emergi-lite.com/usa/nexus.asp.
Dual Lite, Central Lighting Inverter History, Jul. 2008.

\* cited by examiner

EMERGENCY LIGHTING MONITORING AND REPORTING SYSTEM

CROSS REFERENCE TO RELATED APPLICATIONS

This application claims the benefit of U.S. Provisional Patent Application Ser. No. 61/817,138 filed Apr. 29, 2013. This application also claims the benefit of U.S. Provisional Patent Application Ser. No. 61/976,249 filed Apr. 7, 2014. The disclosures of both are incorporated herein by reference.

BACKGROUND OF THE DISCLOSURE

1. Technical Field

The disclosure relates to lighting systems with backup power supplies and, more particularly, to emergency lighting systems with centralized backup power, periodic testing systems and methods, and reporting and monitoring systems and methods.

2. Background Information

Emergency lighting products in the USA and other countries are required to be installed in all commercial, industrial and other buildings with public access. Regulations controlling operation and performance of emergency lighting products in the USA are published by the National Fire Protection Association Life Safety Code No. 101, Chapter 7, Means of Egress (LSC 101). Periodic testing of such equipment is required and described in the LSC 101, and is enforced by the Authority Having Jurisdiction (AHJ). The Life Safety Code names four key elements that must be included in every emergency lighting product using batteries to provide stored energy for emergency lighting following loss of main building power:

1. Battery capacity
2. Lamp operation
3. Transfer switch operation
4. Battery charger operation Testing of all four items is to be performed monthly by simulating a brief loss of main building power, and annually starting 12 months after installation, when emergency operation under battery power for the full rated time is required, commonly 90 minutes but may be longer for certain building occupancies. Results of these tests are to be recorded in permanent written record, to be available for inspection by the AHJ.

Three approved methods for performing the four tests are described in LSC 101, including one describing a computer-based, automated system to minimize the amount of manual labor required, to maintain a history of tests completed, and to produce written test results on demand. Paragraph 7.9.1.3 of LSC 101 contains the following wording: Computer based, self-testing/self diagnostic battery-operated emergency lighting equipment capable of providing a report of the history of tests and failures at all times.

Given the number of fixtures required in typical commercial and industrial buildings, a manual inspection process meeting the requirements for the four tests identified above is labor intensive. With conventional emergency lighting fixtures, monthly and annual tests are accomplished by activation of emergency lighting by pressing a Push to Test (PIT) momentary switch on every fixture. This simulates loss of normal power for as long as the PIT is held down. LSC 101 requires this operation for 30 seconds on every fixture, every month. Results from the test are to be recorded in writing, and the report must be available for inspection by the AHJ at any time. Completion of these tests and reports is an onerous procedure and is rarely accomplished correctly or completely by facility or maintenance managers.

Emergency lighting is required to operate upon loss of normal building power typically supplied by a utility as Alternating Current (AC). Power for emergency lighting must be provided from an independent source, usually batteries, or an electrical generator. The two most common forms of emergency lighting in use today are:

1. Unit equipment, defined as an emergency lighting fixture with a self-contained battery pack, a battery charger and a transfer switch to supply Direct Current (DC) electrical power from the battery for emergency lighting operation upon loss of building power.

2. A central or smaller inverter, defined as a power system that typically includes multiple batteries, a battery charger, a control circuit to convert power supplied by batteries from DC into AC, and a transfer switch to supply this AC power for emergency operation of any standard lighting fixture connected to the inverter.

Both forms rely on stored energy from batteries. When normal power is supplied the batteries are connected to a charger which supplies constant current to ensure they are maintained at full capacity. Upon loss of building power, the transfer switch connects batteries to lamps in the emergency fixtures. In that event, the Life Safety Code stipulates that the amount of battery energy available must be sufficient to operate all emergency lighting lamps for a minimum of 90 minutes, after which the battery terminal voltage must be no less than 87.5% of the rated battery voltage, with the lamps remaining on. This performance requirement is strictly regulated under Underwriters Laboratories (UL) Standard 924 for Emergency Lighting and Power Equipment, which is based on criteria enumerated in LSC 101.

Operating conditions and maintenance problems concerning the two forms are as follows:

Unit Equipment: Batteries most commonly in use today for unit equipment emergency lighting products are Sealed Lead Acid (SLA), Nickel Cadmium (NICAD) or Nickel Metal Hydride (NIMH). Over time, the amount of stored energy in all types of battery will decrease, to the point when a fully charged battery is no longer able to meet the minimum power requirements for emergency operation, and they must then be immediately replaced. The typical average life of SLA batteries is 4 years; that of NICAD or NIMH batteries may be slightly longer. If the ambient temperature around a battery is elevated, as frequently happens in certain building installations, battery life may be less than 4 years.

LSC 101 specifies that all emergency lighting equipment be tested monthly for correct operation of the battery and the three other functions listed above, following a brief battery discharge. Then, every year starting 12 months after installation the fixtures must be tested with a battery discharge of 90 minutes (or more if specified for certain occupancies) at full load. If any of the three functions listed fails, or any battery fails to meet the 87.5% voltage minimum after 90 minutes, the fixture is in violation of the Life Safety Code, must be repaired or replaced to correct the fault, and retested to confirm proper operation. Results from these tests and/or corrections are to be recorded in writing, and the report must be available for inspection by the AHJ at any time. It is therefore important for the facility owner to be vigilant in reviewing the status of emergency lamps and the ability of batteries to maintain the 90 minute discharge.

The problem of review and inspection of unit equipment has been recognized in the industry and products have been developed to perform automatic, self-testing diagnostics of batteries and lamps, typically using a color-coded warning light on the fixture, or in some cases by incorporating a transmitter using WIFI to transfer diagnostic data from multiple fixtures to a central site. While these solutions may help the facility manager to identify equipment with bad lamps or batteries, they are expensive to install and do nothing to reduce the cost of replacing components found to be faulty, which is by far the largest portion of total maintenance expense.

Replacement of batteries and lamps in unit equipment is labor intensive because each fixture with a failed component must be accessed (most often requiring a ladder or a portable lifting system for fixtures in high locations), dismantled, have wiring disconnected, the battery, lamps or other components of the charging mechanism or the transfer switch replaced with new components, followed by reconnection, reassembly and testing. In many products, the battery is part of a package that includes the charger and transfer switch (known as an "emergency ballast'/) which increases the value of the material requiring replacement. In addition, typical batteries or emergency ballasts are manufactured specifically for the fixture and are thus not readily available as a stock item from electrical distributors; they must be carefully identified by part number and purchased direct from the factory or through a specialized supply service.

As described, total cost for routine maintenance of unit equipment for any facility can be substantial, especially in cases where large quantities of fixtures are installed. For example, unit equipment in a typical high school may contain more than one thousand batteries.

Inverters: An inverter may be supplied in a wide range of power capacities, from small models that supply one or a small number of lighting fixture with emergency power, to central power systems that can supply all fixtures throughout a large building. All inverters include a battery charger, a transfer switch and for emergency operation, an electrical circuit to convert DC power supplied from batteries into AC power for the lighting fixtures. The converter circuits are relatively complex and especially in larger machines, expensive. Frequently, multiple batteries are installed in larger machines and connected in series to produce high DC voltages, from 48V to 120V or more. Because of the inherent danger associated with high DC voltages and complex wiring schemes, manufacturers of such equipment usually require installation and setup by factory trained mechanics. Maintenance requiring replacement of batteries is also required to be carried out by factory technicians or electrical contractors with specific experience or training with this type of equipment.

Typical fixtures connected to inverters are designed for general lighting under normal conditions and as such, the lumen output, lamp power and beam spread patters are not optimized for emergency lighting. LSC 101 stipulates that emergency lighting must produce uniform illumination at a specified brightness level from 5 to 50 times lower than general lighting, along a path of egress, therefore an elongated beam spread concentrated along the egress pathway is desirable. However general lighting fixtures are designed to produce lighting over as large an area as possible, and most produce generally circular patterns, not elongated beams. The high power lamps used in these fixtures require far more battery power than lamps designed for emergency lighting. General lighting fixtures with multiple lamps can be configured to operate with a reduced number of lamps for emergency operation, thus saving battery energy, but that cannot be done with single-lamp fixtures.

As a result, general lighting fixtures operate at higher power than is required by the Code, requiring larger, more expensive batteries compared to a central power system for fixtures designed specifically for emergency lighting. Also, more fixtures with circular lighting patterns are required, compared to those with optical means designed to produce an elongated beam spread.

Lamps in use for general lighting may operate an average of 4,380 hours per year (12 hrs/day for 365 days). The most common type of lamps in use today are fluorescent, with an average life of about 15,000 hours or less. Therefore, many lamps will require replacement every 3-4 years and those connected to the emergency circuit will require thorough inspection and regular replacement to maintain code compliance.

SUMMARY OF THE DISCLOSURE

The disclosure provides an efficient system meeting all of the code requirements for testing and extending this capability to include multiple lighting fixtures installed in multiple buildings that can be controlled and investigated from a common location using internet services. The total number of fixtures and buildings are limited only by the size of computer memory allocated. For the purposes described herein, the quantities are in effect, unlimited.

The disclosure provides a central battery system that minimizes total maintenance costs over the life of the system by reducing the number of batteries required, and improving the means of access to batteries for service. The central battery system includes automated self testing capabilities and the ability to transmit data related to the self testing to a remote computer for compilation. The central battery system also can receive instructions from a remote location to change its operation parameters.

The disclosure provides emergency lighting fixtures that use LEDs (Light Emitting Diodes) having an operating life greater than conventional incandescent or fluorescent lamps. The fixtures also include specialized optics producing elongated beam patterns to reduce the total number of fixtures required to meet minimum light levels specified in LSC 101 along a linear path of egress, and specialized electronic circuits have been designed for these fixtures, to reduce the battery power required during emergency operation.

The disclosure provides a system that uses central batteries powering LED fixtures optimized for emergency lighting of egress pathways and automated self-test diagnostics with internet communication combined to produce the lowest possible life cycle costs with superior performance compared to conventional emergency lighting products. The disclosure provides a method of monitoring, testing, and reporting data about these systems to the users of the systems, the owners of the systems, and/or the authority having jurisdiction through Internet-based software.

The disclosure provides a central battery system for providing backup power and self test functions. The system includes an independent direct voltage power supply that allows the LED emergency lighting fixtures to be used in a normal on mode during normal operation of the facility having the fixtures. This allows the fixtures to serve two functions.

The disclosure further provides a system for use with existing LED lighting fixtures that allows these existing fixtures to be used during emergency lighting operations. In one configuration, a control module is associated with each LED fixture and communicates with the dimming function of the LED fixture to reduce the light output of the LED fixture during an emergency lighting situation. The control module can test the lighting fixture for operable function and communicate the test result back to the central battery system through power line communication.

BRIEF DESCRIPTION OF THE DRAWINGS

Similar numbers refer to similar parts throughout the disclosure.

DETAILED DESCRIPTION OF THE DISCLOSURE

Figure 1:
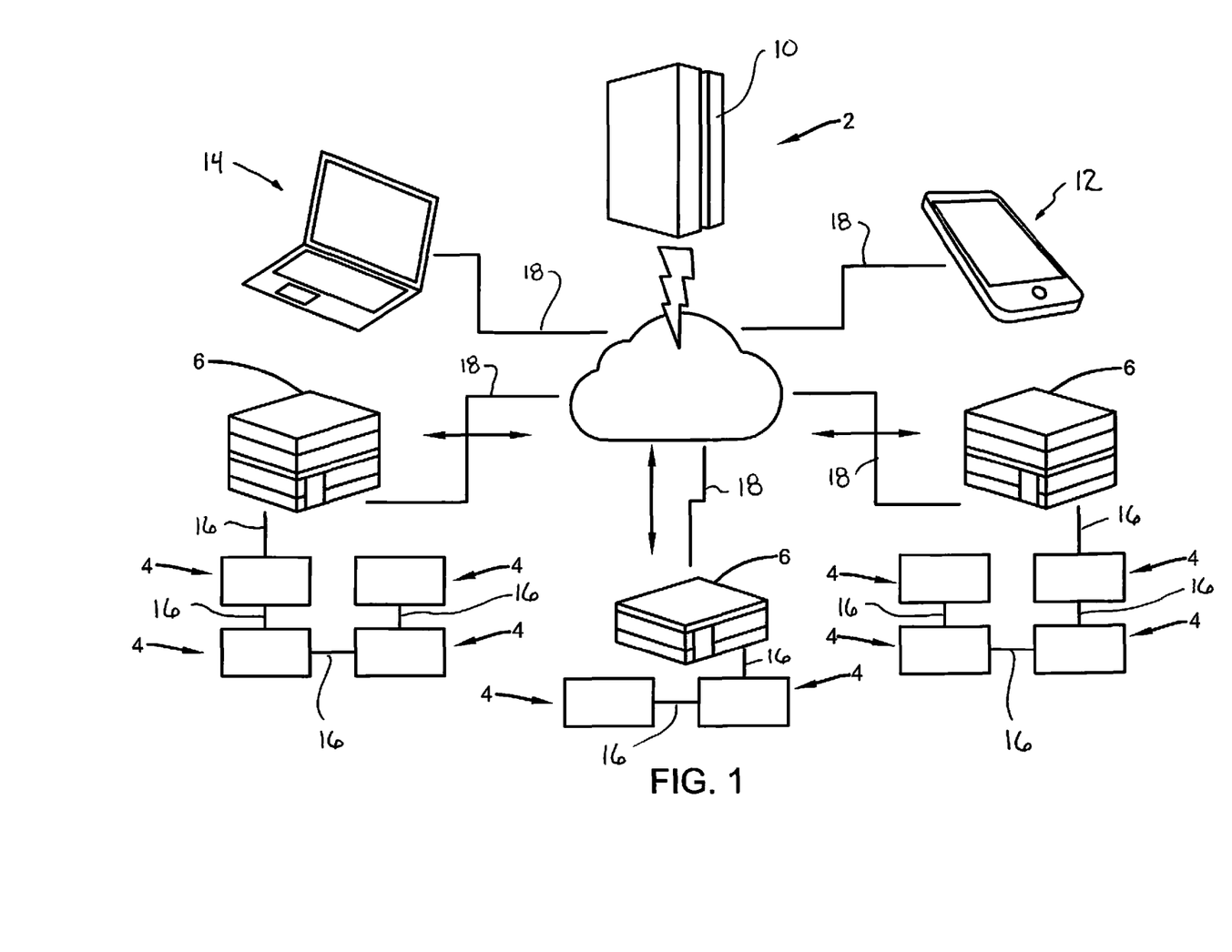
FIG. 1 is an overall schematic of an exemplary system that monitors lighting systems in multiple buildings.

An exemplary emergency lighting monitoring and reporting system 2 includes a plurality of central battery systems 4 located in different buildings 6. Buildings 6 may be geographically distant or geographically together at a common campus. Buildings 6 may be commonly owned or owned by different entities. Each central battery system 4 provides normal on and backup power to at least one but typically a plurality of lighting circuits that each may include a plurality of lighting fixtures 8. Lighting fixtures 8 are emergency lighting fixtures that require a battery backup power so they may be used to provide lighting during power outages. As described above, such battery backup systems must be tested periodically and reports must be available for the AHJ. Each central battery system 4 is adapted to perform the testing and data reporting functions that allow the user of the lighting systems to comply with the requirements of the AHJ. Central battery systems 4 provide the power, testing, and reporting functions for a plurality of circuits that each can have a plurality of lighting fixtures. Systems 4 are centrally located for easy access and maintenance. Systems 4 transmit the data they generate to software accessible by a user through the Internet.

Figure 2:
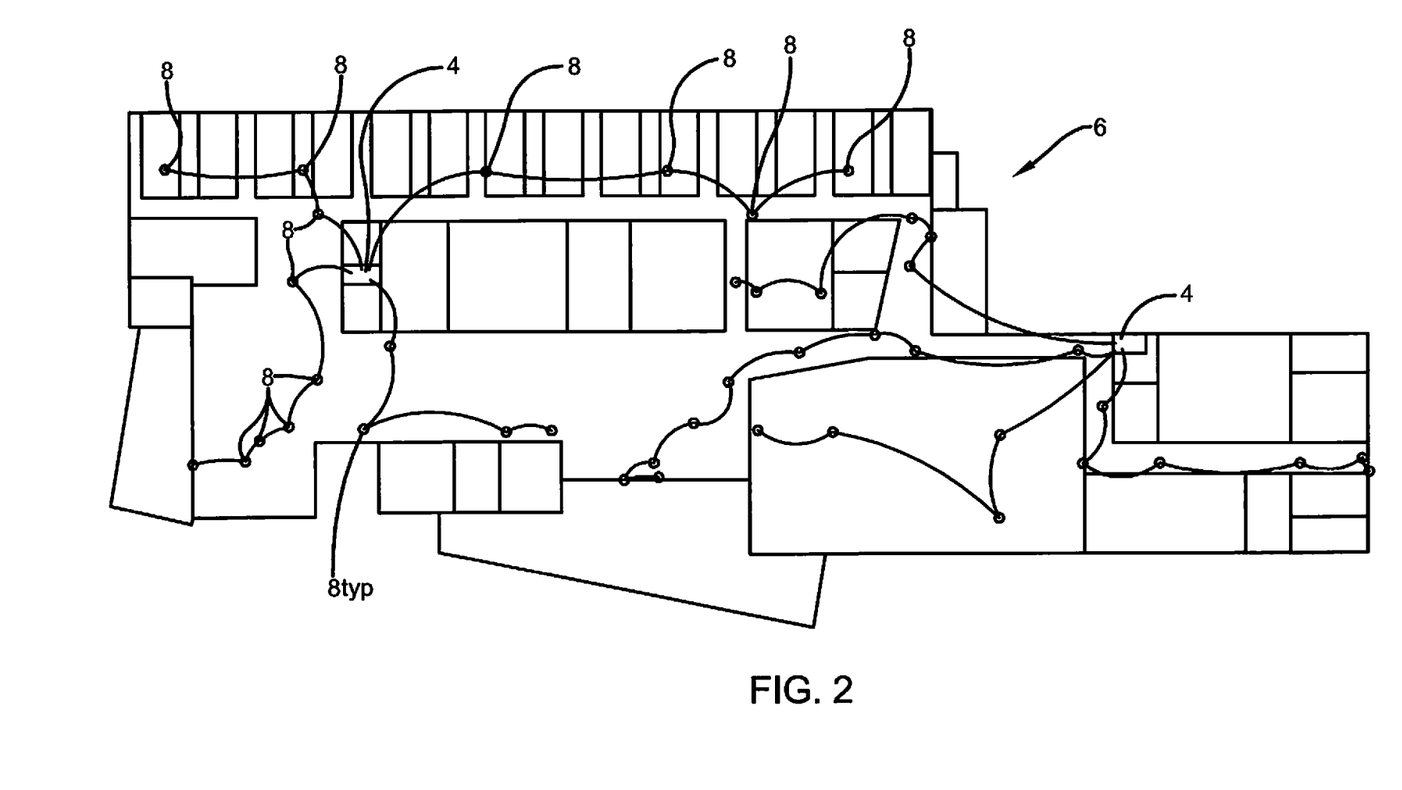
FIG. 2 is a schematic of an exemplary building using two of the central battery systems of the disclosure.

As shown in FIG. 2, a small number of central battery systems 4 are used to serve a plurality of circuits of lighting fixtures 8 such that workers only need to maintain the batteries at the limited number of locations for the central battery systems 4 instead of needing to access each and every lighting fixture 8 location. Central battery systems 4 are located in convenient locations accessible for the person maintaining system 4 while lighting fixtures 8 are typically disposed at elevated locations requiring ladders or lifts for access. The centralized locations of systems 4 decrease maintenance costs. Central battery systems 4 significantly decrease the number of batteries required for a building when lighting fixtures 8 are LED-based low voltage direct current lights. Central battery systems 4 significantly decrease the cost of owning and operating a lighting system in a building. Systems 4 perform automated self testing of the elements required by the LSC. The data generated by these tests is communicated to software 10 that provides access to authorized users and provides for reporting functions required by the AHJ. The cost savings of using system 4 is thus achieved by the power savings, the cost of replacement parts, and the labor required for the testing and reporting. One example of a 25,000 square foot building shows a ten year cost of using fluorescent lighting with individual battery backups to be $4.67 per square foot compared to a $0.20 per square foot cost using central battery system 4 with LED lighting fixtures 8.

Each central battery system 4 is capable of communicating data to centralized data collection software referred to herein as master control monitoring software 10. Software 10 is run on a computer that is located at building 6 or located remotely and connected to systems 4. The computer running software 10 may include a CPU (Central Process Unit), RAM (Random Access Memory), ROM (Read Only Memory), System Bus, Hard Drive Controller, Keyboard Controller, Serial Interface Controller, Parallel Interface Controller, Display Controller, Hard Drive, Keyboard, Serial Peripheral Equipment, Parallel Peripheral Equipment and Display. Among the above devices, the CPU, the RAM, the ROM, the Hard Drive Controller, the Keyboard Controller, the Serial Interface Controller, the Parallel Interface Controller and the Display Controller are coupled to the System Bus. The Hard Drive is coupled to the Hard Drive Controller. The Keyboard is coupled to the Keyboard Controller. The Serial Peripheral Equipment is coupled to the Serial Interface Controller. The Parallel Peripheral Equipment is coupled to the Parallel Interface Controller. The Display is coupled to the Display Controller. It should be understood that this structure is only for exemplary purposes rather than any limitation to the present disclosure. In some cases, some devices can be added to or removed from the computer based on specific situations. The data communicated to software 10 may be the periodic testing data, data relevant to the status of system 4, or data relevant to the status of one or a plurality of lighting circuits or one or a plurality of individual lighting fixtures 8. Each lighting fixture 8 can be provided with a unique identifier so that data relevant to a specific fixture 8 can be generated and communicated. Master control monitoring software 10 can be run on a computer (personal computer, nettop box, local server, or web server) local to the building using the central battery system 4 or systems 4 or on a computer located at a remote location. In either situation, each system 4 communicates with software 10 in any of a variety of known communications methods. When a local computer is used to gather data from system 4, each system 4 can be connected with the local computer through a local wired network formed with one or more Ethernet cables. System 4 can also communicate with software 10 through a wide area or local network. The data may be communicated through the Internet. Central battery systems 4 can deliver data using a wireless communication protocol such as WIFI or a cellular network, through a powerline communications protocol, or through a direct wired connection. The data can be delivered directly to the computer hosting software 10 or through a network of computers using one or a plurality of communications methods. Software 10 can communicate with data collections and compiling software through the Internet so that data relevant to a plurality of locations may be accessed by an authorized user through a common access point. FIG. 1 depicts this arrangement using software 10 located remotely from systems 4 with the collected data being accessed from a mobile device 12 or a personal computer 14 through the Internet. FIG. 1 also depicts the microprocessor for each system 4 being connected via Ethernet cable 16 within its building 6. FIG. 1 depicts an Internet communications link 18 between each building and software 10.

Figure 3:
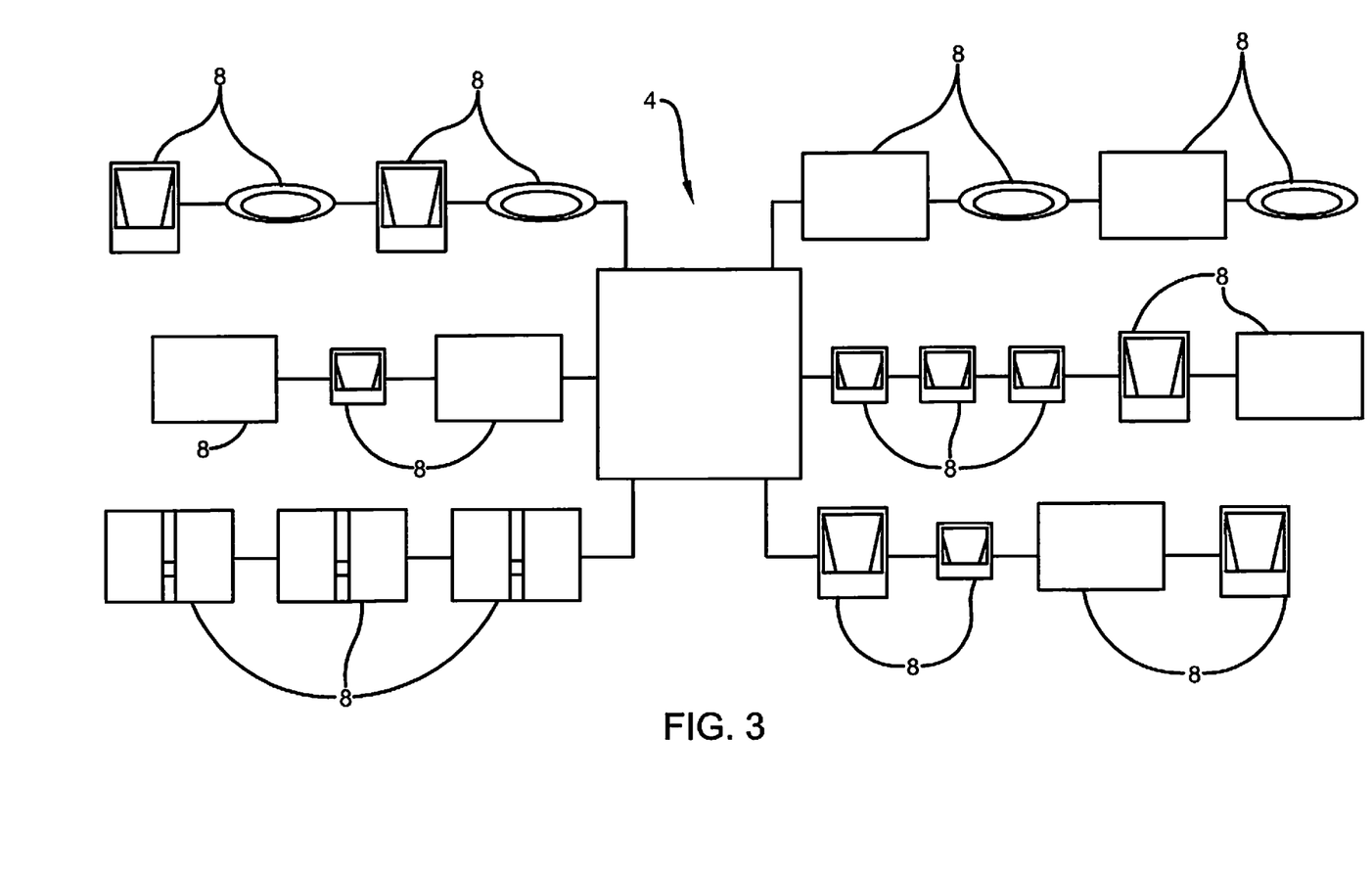
FIG. 3 is a schematic of an exemplary central battery system and a plurality of different light fixtures controlled by the system.

As depicted in FIG. 3, the output circuits (six in this example) from central battery system 4 are connected to LED emergency lighting fixtures 8 which can be pathway lights and exit signs for operation in emergency mode at 24 VDC. Emergency lighting fixtures 8 using LED lamps with each having optical lens configurations designed to optimize the lighting patterns required for greatest efficiency in illumination of the path of egress. Each fixture 8 can have a unique identifier so that data relevant to an individual fixture 8 can be generated and communicated. The number and type of lighting fixture 8 served by system 4 depends on the total watts drawn by each fixture 8 and the power supplied by system 4. In most applications, system 4 will serve a plurality of circuits that each serves a plurality of fixtures 8.

In an exemplary embodiment, each fixture 8 is individually addressable and connected to and monitorable by system 4. Each emergency lighting fixture 8 incorporates a circuit or circuits to allow the electrical insertion of a unique IP address. Twisted pair wiring couples fixtures 8 to a central database providing diagnostic operation data for every lighting fixture 8. Each emergency lighting fixture 8 can include a communications module that allows data about the individual lighting fixture 8 to be communicated back to system 4 through a power line communications protocol. In this embodiment, a separate communications line for each fixture 8 is not required.

Each system 4 is in communication with a computer running software 10 which provides data transfer via the Internet to any connected mobile device 12 or personal computer 14 to allow for customer data monitoring. The communications link between system 4 and software 10 is configured to be a two-way so allow the microprocessor of system 4 to receive instructions from an authorized user from a remote location. The two-way communications connection between system 4 and software 10 allows the customer to change operating specifications of system 4 or fixtures 8. Software 10 allows printed reports to be generated that can be submitted to the AHJ to meet requirements. The report delivered for example from a cloud-based server shows all test parameters required by the Life Safety Code, all building particulars, site locations, with the number of fixtures, central battery systems and buildings limited only by capacity of the internet network in use. The printed test report may be generated from any authorized computer or device in communication with software 10. Graphical displays also may be provided. Reports delivered to the end user may also incorporate a graphical interface which will depict building layouts showing central battery systems 4 and fixture 8 locations on a computer terminal or other graphical display. Components requiring service or with a FAULT report result from diagnostic tests will be highlighted on such a display to enhance the notification and location. The system also can alert a specific user or users if there is a FAULT with any component. The alert can be delivered via email, text, a phone call, or other method of communications.

Figure 4:
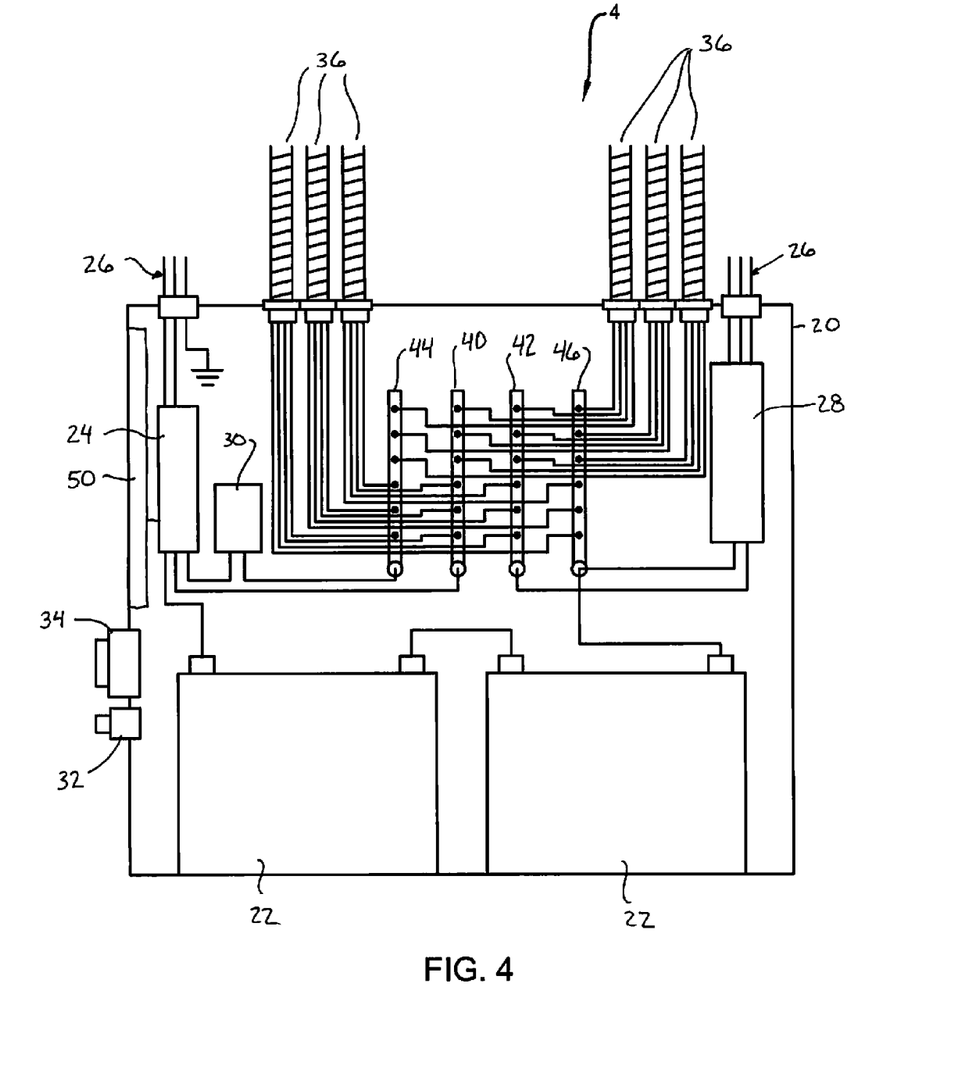
FIG. 4 is a schematic of an exemplary central battery system.

An exemplary central battery system 4 is depicted in FIG. 4. All components required for the operation of system 4 can be contained in an enclosure 20 (the "central battery panel"). Central battery system 4 includes preferably two 12V batteries 22 connected in series to produce an output at 24 VDC. Batteries 22 used in system 4 are standard type SLA (Sealed Lead Acid) models of a type readily available from commercial battery suppliers. Other type batteries 22 may be specified if desired.

System 4 includes a battery charger 24 able to recharge batteries 22 from a state of discharge to full charge in twenty-four hours or less. Battery charger 24 is connected to an input power source such as 120V or 277V AC line power 26. Battery charge 24 may provide an output to power outlet 40 of regular AC line voltage if such AC line voltage is required by remote LED power supplies. Battery charger 24 also may output a low voltage direct current to power outlet 40. System 4 may also include one or more optional low voltage DC power supplies 28 powered by AC line power 26 to operate emergency lighting fixtures 8 in "normal on" mode if day to day use of lighting fixture 8 is desired. One such additional power supply 28 can be used with light fixtures for normal on lighting and another such power supply 28 can be used at a lower DC voltage such as +12 VDC to power exit signs. Circuits in emergency lighting fixtures 8 can include two independent power inputs at 24 VDC, to allow operation in either emergency or normal on mode. System 4 includes a transfer switch 30 that changes condition in the event of a failure in power source 26 so that fixtures 8 are powered by batteries 22. A test switch 32 and a display 34 are provided so that system 4 can be tested manually. The 24 VDC is provided to a plurality of power outlets 36.

An option for system 4 is a battery temperature sensor which disconnects the battery charger if the temperature in the cabinet exceeds a limit. A further option is a cabinet temperature sensor which starts a cabinet cooling fan at a specified temperature. System 4 includes a low voltage sensor that disconnects batteries from the load when the voltage drops to less than 87.5 percent of rated voltage. This disconnect feature prevents deep battery discharge. System 4 automatically restarts when AC power returns.

In the exemplary configuration of system 4, four power outlets 40, 42, 44, and 46 are provided. These can be connected to up to eight circuits 36 which each may power a plurality of fixtures 8. System 4 includes a power outlet 40 for battery charger 24. This outlet can be used to power standard AC lighting fixtures and remote LED power supplies when such power is needed. Outlet 40 also can be a low voltage DC outlet for normal on security lighting or exit signs. Power outlet 42 provides 24 VDC power from power supply 28 when such a supply is provided as part of system 4. The positive side of the battery power is supplied to power outlet 44 for emergency power which is run through switch 30. The negative side of the battery power is provided at outlet 46. In another configuration, system 4 can include a common negative direct current wiring connection 46 with a positive DC connection for emergency battery power, a positive DC connection for normal on power, and a positive DC connection for normal on power delivered to exit signs or security lighting circuits.

Each central battery system 4 includes a computer, microprocessor, an electronic circuit, electronic circuits, one or more logic controllers, one or more programmable controllers, a computer, or a controller (regardless of the structure of the device running the instructions, the term "control board 50" is used herein to identify this structure) adapted to store and run the software used to operate system 4. In some configurations, battery charger 24 is combined with control board 50. Power supplies 28 also may be provided as part of control board 50.

Control board 50 is capable of accepting data from an RS585 network connected to the emergency lighting fixtures 8, or data provided over the output power circuits using a power line communication device in each fixture 8. Control board 50 is capable of accepting instructions from a remote computer to change the operational parameters of system 4. An example of a control board structure is a Linux computer that connects to the Internet and runs software such as Android 4.0. For example, a BeagleBone board (a processor, RAM, Ethernet, 46-pin expansion connectors, a microSD slot, and a USB host port and multipurpose device port which includes low-level serial control and JTAG hardware debug connections) may be used as the control board 50. Central battery system 4 retains its system configuration and its functions even when disconnected from AC line power 26. The battery power is configured to continue the operations of system 4.

Control board 50 is programmed to automatically perform all the operating functions stipulated the NFPA Life Safety Code namely: computer based, self-testing/self diagnostic battery-operated emergency lighting equipment capable of providing a report of the history of tests and failures at all times. The testable four emergency lighting functions include battery condition, transfer switch operation, battery charger function, and connected emergency load function. The batteries are tested at least every twenty-eight days for voltage and discharge rate. At least every twelve months, the batteries are discharged under full load to confirm a minimum of 87.5 percent of rated voltage after a ninety minute discharge. The discharge and timing parameters can be changed through external programming by the user. At least every twenty-eight days, the automatic transfer switch is tested to ensure full load transfer after any loss of AC power. At least every twenty-eight days, the connected emergency load is tested. Two options for this test are provided. The first option is the testing and reporting for a failure of any single lighting fixture or circuit. The second option is the testing and reporting of any single circuit. The report identifies the existence of a failure and the location of the failure. The control board 50 includes a computer-controlled program to monitor and test system 4 and the emergency lighting fixtures 8 and it has the ability to accept software modified for other operating parameters required to meet procedures, tests or functions defined in any codes, regulations or customer requirements. Control board 50 also includes software to transfer data generated by the self test/self diagnostic functions to software 10 or to an internet server.

In one configuration, an electronic circuit powering LED emergency lighting fixtures 8 (the "driver" circuit) incorporates a method for controlling power consumption of the fixtures 8 over the time of battery operation at a predetermined drawdown rate to minimize total power required from the batteries. The brightness of the fixtures may start at 100 percent and be stepped down to 60 percent over the ninety minutes of operation under battery power.

The driver circuits are designed to provide constant current power to the LEDs for illumination and each LED shall be driven independently such that failure of any single LED shall not cause failure of any other LED.

Figure 5:
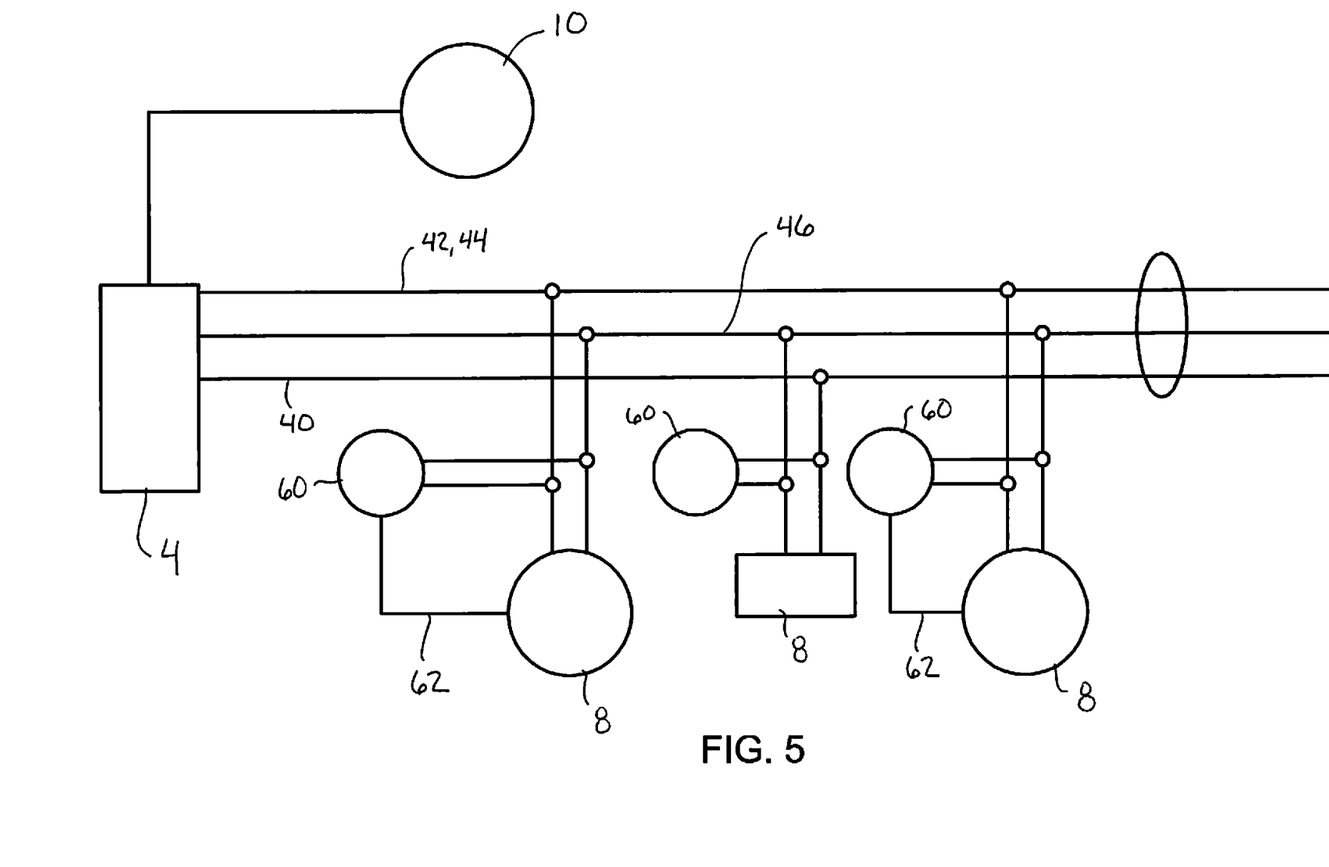
FIG. 5 is a schematic of a portion of a lighting system using three addressable control modules.

Another feature of the disclosure is the use of an Addressable Control Module ("ACM") 60 to allow existing LED lighting fixtures 8 to be used in emergency situations to provide emergency lighting. This configuration is depicted in FIG. 5 and shows exemplary uses for the ACM 60. An ACM 60 is installed and connected to an existing LED general lighting fixture 8 to allow the fixture 8 to operate in emergency mode using power supplied by the system 4 following failure of the main building power supply 26. The ACM 60 includes or may be combined with a device that will control the power level input to the lighting fixture 8 following failure of the main power supply 26. The device uses an existing dimmer control 62 with 0-10V input for the existing LED general lighting fixture 8. The emergency lighting output is set to a level which is typically less than that required for normal lighting. For example, the light output during an emergency situation may be set to as low as 10 percent the light output during normal use. The existing LED lighting fixture may be a general lighting fixture, a sign such as an EXIT sign, an existing emergency lighting fixture, or a secondary lighting feature. FIG. 5 shows the fixtures 8 having the dimmer controls 62 being connected to power line 42 or 44 which has a direct current Voltage greater than 20 Volts. The Exit sign configuration that does not have the dimmer controls 62 is connected to power line 40 having a direct current Voltage of under 21 Volts. This lower Voltage may be 12 Volts.

The ACM 60 may include a device that will monitor the lamp operation within the lighting fixture to determine status of lamp operation (PASS or FAIL).

The ACM 60 may have a unique IP address compatible with a Power Line Communication system to allow PASS FAIL data to be processed and recorded by the system 4 for each fixture 8 connected to the system 4.

In the foregoing description, certain terms have been used for brevity, clearness, and understanding. No unnecessary limitations are to be implied therefrom beyond the requirement of the prior art because such terms are used for descriptive purposes and are intended to be broadly construed. Moreover, the above description and attached illustrations are an example and the invention is not limited to the exact details shown or described. Throughout the description and claims of this specification the words "comprise" and "include" as well as variations of those words, such as "comprises," "includes," "comprising," and "including" are not intended to exclude additives, components, integers, or steps.

The invention claimed is:

1. An emergency lighting system having a self-test capability; the system comprising:
   at least one circuit that includes a plurality of emergency LED lighting fixtures;
   a central battery system that provides direct current as normal power and direct current backup power to the circuit of emergency LED lighting fixtures;
   the normal power being supplied by line power;
   the central battery system including at least one battery that is adapted to supply direct current to the circuit when line power to the central battery system is off;
   a battery charger connected to the line power; the battery charger maintaining the battery in a charged condition;
   a transfer switch configured to connect the battery to the circuit when the line power is off; and
   a control board that performs tests of the battery capacity, the operation of the LED lighting fixtures, the operation of the transfer switch; and the battery charger; the control board communicating data related to the tests to software located at a remote location.

2. The system of claim 1, wherein each of the emergency LED lighting fixtures has an individual identifier and is in communication with the control board through power line communication; the communication providing at least the operational status of the emergency LED lighting fixture.

3. The system of claim 1, further comprising a secondary low voltage direct current power supply that provides direct current power to a plurality of the emergency LED lighting fixtures allowing these fixtures to be used during normal lighting as well as for emergency lighting.

4. The system of claim 1, wherein the emergency LED lighting fixtures are wired such that any one of the emergency LED lighting fixtures can while allowing the others to continue operating.

5. The system of claim 1, further comprising a plurality of emergency LED lighting fixture circuits that are each backed up by the central battery system.

6. The system of claim 1, wherein the control board of the central battery system is connected to a local computer with an Ethernet connection; the local computer having an internet connection; the data related to the tests being communicated to the software located at the remote location through the local computer.

7. The system of claim 1, wherein the tests performed by the control board meet the requirements of section 101 of the Life Safety Code in the United States.

8. The system of claim 7, wherein the software formats the data for a printable report.

9. The system of claim 1, wherein the central battery system reduces the power level of the backup power over a time period to save battery power.

10. The system of claim 9, wherein the reduction in power reduces the brightness of the emergency LED lighting fixtures by no more than forty percent.

11. A method of monitoring and testing battery backup systems for emergency lighting circuits; the method comprising the steps of:
provided a first central battery system for at least one circuit of a plurality of emergency LED lighting fixtures;
providing a second central battery system for at least one circuit of a plurality of emergency LED lighting fixtures; the second central battery system being located in a different building structure than the first central battery system;
each of the first and second central battery systems including at least one battery that is adapted to supply direct current to the circuit during a power outage, a battery charger maintaining the battery in a charged condition, a transfer switch configured to connect the battery to the circuit, and a control board that performs tests of the battery capacity, the operation of the LED lighting fixtures, the operation of the transfer switch, and the battery charger to create test results;
sending the test results generated by the control board to software located at a remote location; and
allowing authorized users to access to the test results through the software.

12. The method of claim 11, further comprising the step of communicating the status of the LED lighting fixtures to the control board through power line communication.

13. An emergency lighting system having a diagnostic self-test capability; the system comprising:
at least one low voltage branch circuit that includes a plurality of emergency LED lighting fixtures;
a central battery system that provides direct current emergency power to the at least one low voltage branch circuit of emergency LED lighting fixtures and optional direct current as normal power when required;
the normal power to the central battery system being supplied by line power;
the central battery system including at least one battery that is adapted to supply direct current to the emergency lighting circuit when line power to the central battery system is off;
a battery charger connected to the line power; the battery charger maintaining the battery in a charged condition;
a transfer switch configured to connect the battery to the circuit when the line power is off; and
a control board that has an individual internet protocol (IP) address and performs diagnostic tests of the battery capacity, the operation of the LED lighting fixtures, the operation of the transfer switch, and the battery charger; the control board communicating data related to the tests in digital format to a remote location via the internet.

14. The system of claim 13, wherein the tests performed by the control board meet the requirements of the National Fire Protection Association Life Safety Code 101 ("LSC 101") in the United States and may be modified to perform tests required by other jurisdictions.

15. The system of claim 13, wherein the control board of the central battery system is connected to a local computer network with an Ethernet connection; the network having an internet connection; the data related to the tests being communicated to a remote location through the internet.

16. The system of claim 13, wherein if the test results identify a fault of any emergency system component as defined by LSC 101, the control board automatically generates an email to send a fault report via the internet to any assigned address and if no fault is detected, the system will maintain in memory all records of the tests for access on demand.

17. The system of claim 13, wherein the diagnostic self-test data is accessible through the Internet at any time on demand by an authorized user.

18. The system of claim 13, wherein the system, at any time on demand by an authorized user, formats the diagnostic self-test data to produce a written record in the form of a printable report as mandated by LSC 101.

19. The system of claim 13, further comprising a secondary low voltage direct current power supply that provides power to a plurality of the emergency LED lighting fixtures, allowing these fixtures to be used during normal lighting as well as for emergency lighting.

20. The system of claim 13, wherein each of the emergency LED lighting fixtures has an individual internet protocol (IP) address.

21. The system of claim 20, in which each emergency fixture is in communication with the control board through power line communication; the communication providing at least the operational status of the emergency LED lighting fixture.

22. The system of claim 13, wherein a emergency lighting fixture driver circuit reduces the power level of the emergency fixtures over the required time period to save battery power.

23. The system of claim 22, wherein the reduction in power reduces the brightness of the emergency LED lighting fixtures by no more than forty percent during the required period of emergency operation.

* * * * *